United States Patent
Joe et al.

(10) Patent No.: US 9,897,660 B2
(45) Date of Patent: Feb. 20, 2018

(54) APPARATUS AND METHOD FOR ESTIMATING PARAMETER OF SECONDARY BATTERY

(71) Applicant: LG CHEM, LTD., Seoul (KR)

(72) Inventors: Won-Tae Joe, Daejeon (KR); Sun-Young Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 667 days.

(21) Appl. No.: 14/530,979

(22) Filed: Nov. 3, 2014

(65) Prior Publication Data

US 2015/0051854 A1    Feb. 19, 2015

Related U.S. Application Data

(63) Continuation of application No. PCT/KR2013/011129, filed on Dec. 3, 2013.

(30) Foreign Application Priority Data

Dec. 3, 2012  (KR) .................. 10-2012-0139050
Dec. 3, 2013  (KR) .................. 10-2013-0149258

(51) Int. Cl.
*G01R 31/36*    (2006.01)

(52) U.S. Cl.
CPC ..... *G01R 31/3648* (2013.01); *G01R 31/3624* (2013.01)

(58) Field of Classification Search
CPC ............................................. G01R 31/3624
See application file for complete search history.

(56) References Cited

U.S. PATENT DOCUMENTS

2006/0232277 A1   10/2006   Murakami et al.
2006/0276980 A1*  12/2006   Mizuno ............... G01R 31/361
                                                            702/63
(Continued)

FOREIGN PATENT DOCUMENTS

CN      101688899 A      3/2010
EP      2 952 919 A1    12/2015
(Continued)

OTHER PUBLICATIONS

International Search Report issued in PCT/KR2013/011129, dated Mar. 14, 2014.

(Continued)

*Primary Examiner* — Manuel A Rivera Vargas
(74) *Attorney, Agent, or Firm* — Birch, Stewart, Kolasch & Birch, LLP

(57) ABSTRACT

Disclosed is an apparatus and method for estimating a parameter of a secondary battery. The apparatus according to the present disclosure includes a sensor means configured to measure a plurality of current-voltage data while a charging current decreases when a secondary battery is charged in such a pattern that the charging current increases to a peak value and then decreases, and a control means configured to receive an input of the plurality of current-voltage data from the sensor means, calculate a linear approximation equation representing a correlation between a current and a voltage from the plurality of current-voltage data, and estimate a Y intercept of the linear approximation equation as an open-circuit voltage of the secondary battery.

25 Claims, 12 Drawing Sheets

(56) References Cited

U.S. PATENT DOCUMENTS

| | | | |
|---|---|---|---|
| 2007/0090805 A1 | 4/2007 | Mizuno et al. | |
| 2010/0090651 A1* | 4/2010 | Sahu | G01R 31/3624 320/132 |
| 2010/0174499 A1 | 7/2010 | Kang et al. | |
| 2012/0219840 A1 | 8/2012 | Choi et al. | |
| 2013/0138370 A1* | 5/2013 | Oh | G01R 31/3624 702/63 |

FOREIGN PATENT DOCUMENTS

| | | |
|---|---|---|
| JP | 5-004736 U | 1/1993 |
| JP | 8-031461 A | 2/1996 |
| JP | 2000-323183 A | 11/2000 |
| JP | 2001-223033 A | 8/2001 |
| JP | 2004-271445 A | 9/2004 |
| JP | 2007-121030 A | 5/2007 |
| JP | 2011-18547 A | 1/2011 |
| JP | 2011-43460 A | 3/2011 |
| KR | 10-2006-0039445 A | 5/2006 |
| KR | 10-1147602 B1 | 5/2012 |

OTHER PUBLICATIONS

Written Opinion issued in PCT/KR2013/011129, dated Mar. 14, 2014.

* cited by examiner

APPARATUS AND METHOD FOR ESTIMATING PARAMETER OF SECONDARY BATTERY

CROSS-REFERENCE TO RELATED APPLICATION

The present application is a continuation of International Application No. PCT/KR2013/011129 filed on Dec. 3, 2013, which claims priority to Korean Patent Application No. 10-2012-0139050 filed in the Republic of Korea on Dec. 3, 2012, and Korean Patent Application No. 10-2013-0149258 filed in the Republic of Korea on Dec. 3, 2013, the disclosures of which are incorporated herein by reference.

TECHNICAL FIELD

The present disclosure relates to an apparatus and method for estimating a parameter indicating an electrochemical property of a secondary battery changing with charge or discharge of the secondary battery such as an open-circuit voltage or a state of charge of the secondary battery.

BACKGROUND ART

A battery is a device that produces electrical energy through electrochemical oxidation and reduction reactions, and has a wide range of various applications. For example, application of a battery is gradually expanding to a power source of handheld portable devices such as a mobile phone, a laptop computer, a digital camera, a video camera, and an electric tool; various types of electric-powered devices such as an electric bike, an electric motorcycle, an electric vehicle, a hybrid vehicle, an electric boat, and an electric aircraft; an energy storage system used to store energy produced through new renewable energy or excess energy in an electricity-generating plant; and an uninterruptible power supplier for stable power supply to various information and communication devices including a server computer and a base station for wireless communication.

A battery includes three basic elements; one is an anode including a material which oxides while emitting electrons during discharging, another is a cathode including a material which reduces while accepting electrons during discharging, and the other is an electrolyte which allows ions to move between the anode and the cathode.

A battery may be classified into a primary battery that cannot be reused after discharged, and a secondary battery that can be charged and discharged repeatedly due to at least partially reversible electrochemical reactions.

As a secondary battery, a lead-acid battery, a nickel-cadmium battery, a nickel-zinc battery, a nickel-iron battery, a silver-oxide battery, a nickel metal hydride battery, a zinc-manganese dioxide battery, a zinc-bromine battery, a metal-air battery, and a lithium secondary battery are known. Among them, a lithium secondary battery has a higher energy density, a higher battery voltage, and a longer lifespan than the other secondary batteries, and for these reasons, is attracting the greatest attention in commercial aspects.

A lithium secondary battery has a characteristic that intercalation and de-intercalation reactions of lithium ions occur at a cathode and an anode. That is, during discharging, lithium ions de-intercalated from an anode material included in an anode moves to a cathode through an electrolyte and are intercalated into a cathode material included in the cathode, and vice versa during charging.

In the lithium secondary battery, because a material used as a cathode material significantly affects performance of the secondary battery, various attempts have been made to provide a cathode material having a high energy capacity while maintaining stability at high temperature as well as having low manufacturing costs. However, use of only one cathode material has a limitation in satisfying all the industrial performance standards.

Recently with the growing concerns on exhaustion of fossil fuels and air pollution, there is a drastic increase in demand for eco-friendly energy. In this context, commercialization of an electric drive vehicle such as an electric vehicle or a hybrid vehicle that is powered and runs by electrical energy supplied from a secondary battery is being accelerated by developed countries.

When an electric drive vehicle runs, a state of charge (SOC) of a secondary battery is a parameter needed to estimate a residual driving distance of the electric drive vehicle, and to control the start and end of the charge or discharge of the secondary battery.

A SOC of a secondary battery may be estimated correctly by measuring an open-circuit voltage of the secondary battery. This is because a SOC of a secondary battery has a one-to-one relationship with an open-circuit voltage of the secondary battery. However, it is impossible to measure an open-circuit voltage of a secondary battery during charging or discharging of the secondary battery.

Accordingly, conventionally, complex mathematical models or an experimentally-made lookup table capable of mapping an open-circuit voltage with temperature and voltage of the secondary battery were used to estimate an open-circuit voltage of a secondary battery.

However, the former method has a disadvantage of requiring a complicated calculation, and the latter method has a drawback in that accuracy reduces when applied during charging or discharging of a secondary battery under a dynamic condition. Particularly, in the case of an electric vehicle or a hybrid vehicle, when a driver works an accelerator pedal, a secondary battery is discharged at rapidly changing discharge rates (C-rate), and when the driver works a brake pedal, the secondary battery performs regeneration charging, and this process repeats. Therefore, there is a need for a new approach to estimate a SOC of a secondary battery conveniently and correctly in a dynamic usage environment of the secondary battery.

DISCLOSURE

Technical Problem

The present disclosure is designed to solve the problem of the related art, and therefore, the present disclosure is directed to providing an apparatus and method for estimating an open-circuit voltage and/or a state of charge (SOC) of a secondary battery conveniently and correctly during dynamic use of the secondary battery.

Also, the present disclosure is directed to providing an apparatus and method that estimates conveniently and correctly an open-circuit voltage and/or a SOC of a secondary battery exhibiting a unique electrochemical behavior due to a blended cathode material of at least two cathode materials included therein in consideration of improved performance required for secondary batteries in the market.

Technical Solution

To achieve the above object, an apparatus for estimating a parameter of a secondary battery according to one aspect of the present disclosure includes a sensor means to measure a plurality of current-voltage data while a charging current decreases when a secondary battery is charged in such a pattern that the charging current increases to a peak value and then decreases, and a control means to receive an input of the plurality of current-voltage data from the sensor means, to calculate a linear approximation equation representing a correlation between a current and a voltage from the plurality of current-voltage data, and to estimate a Y intercept of the linear approximation equation as an open-circuit voltage of the secondary battery.

Preferably, the control means may further estimate a state of charge (SOC) of the secondary battery from the estimated open-circuit voltage.

According to one aspect, the sensor means may measure the plurality of current-voltage data while a charging current decreases from a peak value to zero when the secondary battery is charged by a charging current profile in which the charging current increases from zero to the peak value and then decreases zero.

According to another aspect, the sensor means may measure the plurality of current-voltage data when the secondary battery is charged by the charging current profile after a discharging current of the secondary battery gradually decreases to zero.

According to still another aspect, the sensor means may measure the plurality of current-voltage data after the charging current decreases to $1/3$ or less based on the peak value.

According to yet another aspect, the sensor means may measure the plurality of current-voltage data after the charging current decreases to $1/6$ or less based on the peak value.

Preferably, the sensor means may measure at least two current-voltage data.

According to one aspect, the control means may estimate a SOC corresponding to the estimated open-circuit voltage using a lookup table or a lookup function that defines a correlation between an open-circuit voltage and a SOC.

According to another aspect, the sensor means may measure a temperature of the secondary battery and provide the measured temperature to the control means, and the control means may estimate a SOC corresponding to the temperature of the secondary battery and the estimated open-circuit voltage using a lookup table or a lookup function that defines a correlation between an open-circuit voltage and a temperature and a SOC.

To achieve the above object, an apparatus for estimating a parameter of a secondary battery according to another aspect of the present disclosure includes a sensor means to measure current-voltage data repeatedly at a time interval while a secondary battery is charged in such a pattern that the charging current increases to a peak value and then decreases, and a control means to receive an input of the current-voltage data from the sensor means, to identify a plurality of current-voltage data measured while the charging current decreases from the peak value, to calculate a linear approximation equation representing a correlation between a current and a voltage from the plurality of current-voltage data, and to estimate a Y intercept of the linear approximation equation as an open-circuit voltage of the secondary battery.

Preferably, the control means may further estimate a SOC of the secondary battery from the estimated open-circuit voltage.

According to one aspect, the control means may identify the plurality of current-voltage data among current-voltage data measured after a magnitude of the charging current decreases to $1/3$ or less based on the peak value.

According to another aspect, the control means may identify the plurality of current-voltage data among current-voltage data measured after a magnitude of the charging current decreases to $1/6$ or less based on the peak value.

Preferably, the control means may identify at least two current-voltage data.

According to one aspect, the sensor means may measure current-voltage data repeatedly at a time interval while the secondary battery is charged in such as pattern that the charging current increases from zero to the peak value and then decreases zero.

According to another aspect, the sensor means may measure current-voltage data repeatedly at a time interval when the secondary battery is charged after a discharging current of the secondary battery gradually decreases to zero.

The above apparatuses for estimating the parameter of the secondary battery may further include a display means combined with the control means, and the control means may output the estimated open-circuit voltage and/or the estimated SOC of the secondary battery as a graphical interface (a character, a number, a graph, and the like) through the display means.

Also, the above apparatuses for estimating the parameter of the secondary battery may transmit the estimated open-circuit voltage and/or the estimated SOC of the secondary battery to an external control device.

Also, the above apparatuses for estimating the parameter of the secondary battery may further a storage means combined with the control means, and the control means may record and/or erase and/or update and/or transmit the plurality of current-voltage data and/or a slope and a Y intercept of the linear approximation equation and/or the lookup table or the lookup function and/or the estimated open-circuit voltage and/or the estimated SOC into the storage means.

Also, the above apparatuses for estimating the parameter of the secondary battery may be included various electric-powered devices supplied with energy from the secondary battery.

To achieve the above object, a method for estimating a parameter of a secondary battery according to one aspect of the present disclosure includes measuring a plurality of current-voltage data while a charging current decreases when a secondary battery is charged in such a pattern that the charging current increases to a peak value and then decreases, calculating a linear approximation equation representing a correlation between a current and a voltage from the plurality of measured current-voltage data, and estimating a Y intercept of the linear approximation equation as an open-circuit voltage of the secondary battery.

To achieve the above object, a method for estimating a parameter of a secondary battery according to another aspect of the present disclosure includes measuring current-voltage data repeatedly at a time interval while a secondary battery is charged in such a pattern that the charging current increases to a peak value and then decreases, identifying a plurality of current-voltage data measured while the charging current decreases from the peak value, among the measured current-voltage data, calculating a linear approximation equation representing a correlation between a current and a voltage from the plurality of identified current-voltage data, and estimating a Y intercept of the linear approximation equation as an open-circuit voltage of the secondary battery.

Preferably, the method for estimating the parameter of the secondary battery may further include estimating a SOC of the secondary battery from the estimated open-circuit voltage.

Also, the method for estimating the parameter of the secondary battery may further include storing and/or transmitting and/or displaying the estimated open-circuit voltage and/or the estimated SOC.

The secondary battery may further include an electrolyte including working ions, and a separator to electrically separate a cathode from an anode and allow the working ions to move. The electrolyte is not limited to a specific type if it includes working ions and may cause an electrochemical oxidation or reduction reaction at a cathode and an anode using the working ions.

The secondary battery may further include a casing to seal the cathode, the anode, and the separator. The casing does not have special limitation in its material if it has chemical safety.

An outer appearance of the secondary battery is determined by a structure of the casing. The structure of the casing may be one of the various structures known in the art, and typically, may have a cylindrical shape, a prismatic shape, a pouch shape, a coin shape, and the like.

Advantageous Effects

According to the present disclosure, an open-circuit voltage and/or a state of charge (SOC) of a secondary battery may be reliably estimated during dynamic charging of the secondary battery. Particularly, for a secondary battery including a blended cathode material showing a unique voltage change pattern, reliable estimation of an open-circuit voltage and/or a SOC may be also achieved. Also, reliability of a parameter of a secondary battery may be improved by estimating the parameter of the secondary battery using current-voltage data of the secondary battery in such a state that accumulation of polarization at a cathode and/or an anode is reduced.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

MODE FOR DISCLOSURE

Figure 1:
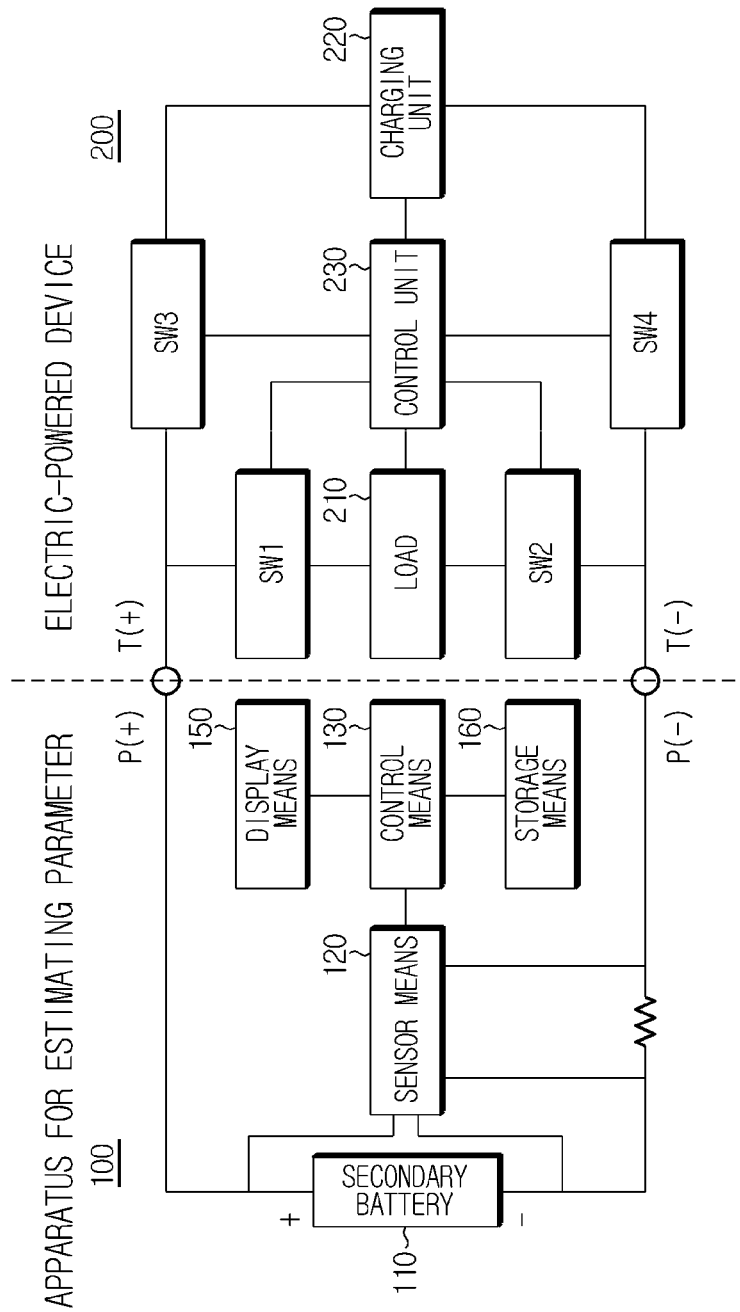
FIG. 1 is a block diagram schematically illustrating construction of an apparatus for estimating a parameter of a secondary battery according to an exemplary embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below dictates a case in which the technical aspects of the present disclosure are applied to a lithium secondary battery. Here, a lithium secondary battery is a secondary battery in which action of lithium ions as working ions causes an electrochemical reaction at a cathode and an anode during charging and discharging. The working ions represent ions participating in the electrochemical oxidation and reduction reactions during charging and discharging of the secondary battery, and for example, lithium may work so. Accordingly, any secondary battery using lithium ions as working ions should be construed as being included in the scope of the lithium secondary battery even though the name of the secondary battery changes based on a type of an electrolyte or a separator used in the lithium secondary battery, a type of a casing used to package the secondary battery, an internal or external structure of the lithium secondary battery, and the like.

Also, the present disclosure may be applied to secondary batteries other than a lithium secondary battery. Accordingly, even though lithium ions are not working ions, any secondary battery to which the technical aspects of the present disclosure may be applied should be construed as being included in the scope of the present disclosure regardless of its type. It should be noted that, in certain embodiments in which the term 'secondary battery' is used instead of the term 'lithium secondary battery', a secondary battery in the corresponding embodiments is used as a concept of encompassing various types of secondary batteries.

Also, a secondary battery is not limited to a number of elements constituting the secondary battery. Accordingly, a secondary battery should be construed as including not only a unit cell including an anode, an electrolyte, and a cathode as a basic unit, but also an assembly of unit cells, a module produced by connecting a plurality of assemblies in series and/or in parallel, a pack produced by connecting a plurality of modules in series and/or in parallel, a battery system produced by connecting a plurality of packs in series and/or in parallel, and the like.

FIG. 1 is a block diagram schematically illustrating construction of an apparatus for estimating a parameter of a secondary battery according to an exemplary embodiment of the present disclosure.

Referring to FIG. 1, a high potential terminal and a low potential terminal (P+, P−) of the secondary battery 110 are electrically coupled with a low potential connection terminal and a high potential connection terminal (T+, T−) of an electric-powered device 200.

The secondary battery 110 may be a lithium secondary battery, but the present disclosure is not limited by a battery type.

In one embodiment, the electric-powered device 200 may be a mobile computer device such as a mobile phone, a laptop computer, and a tablet computer, or a handheld multimedia device including a digital camera, a video camera, and audio/video player.

In another embodiment, the electric-powered device 200 may be an electric transport system powered by electricity such as an electric vehicle, a hybrid vehicle, an electric bike, an electric motorcycle, an electric train, an electric boat, an electric aircraft, or a power tool including a motor such as electric drill and an electric grinder.

In still another embodiment, the electric-powered device 200 may be a large capacity energy storage system installed in an electrical grid to store new renewable energy or excess energy of a electricity-generating plant, or an interruptible power supplier to supply power to various information and communication systems including a server computer or a mobile communication equipment in case of emergency such as blackout.

The electric-powered device 200 includes a load 210 and/or a charging unit 220.

The load 210 is a device that consumes electrical energy of the secondary battery 110, and as a non-limiting example, may be a rotary drive device such as a motor or a power conversion device such as a converter or an inverter.

The charging unit 220 is a device that applies a charging current to the secondary battery 110, and as a non-limiting example, may be a charging circuit, a generator coupled to an engine of an electric drive vehicle, a regeneration charger coupled to a brake of an electric-powered vehicle, and the like.

The electric-powered device 200 may include a control unit 230 to control operation of the load 210 and/or the charging unit 220. The control unit 230 may include a microcomputer to execute a software algorithm for controlling operation of the electric-powered device 200.

The electric-powered device 200 may also include first through fourth switches SW1-SW4 to selectively connect the secondary battery 110 and the load 210 or the secondary battery 110 and the charging unit 220.

The first and second switches SW1 and SW2 turns on or off an electrical connection between the secondary battery 110 and the load 210 in response to a control signal received from the control unit 230.

The third and fourth switches SW3 and SW4 turns on or off an electrical connection between the secondary battery 110 and the charging unit 220 in response to a control signal received from the control unit 230.

Preferably, the first through fourth switches SW1-SW4 may be a semiconductor switch or a mechanical relay switch.

The control unit 230 turns on or off an electrical connection between the secondary battery 110 and the load 210 or between the secondary battery 110 and the charging unit 220.

In one example, when a state of charge (SOC) of the secondary battery 110 is high, the control unit 230 connects the secondary battery 110 to the load 210 by turning on the first and second switches SW1 and SW2, to operate the load 210 by electrical energy stored in the secondary battery 110. Then, the secondary battery 110 is discharged so that electrical energy is provided to the load 210.

In another example, when a SOC of the secondary battery 110 is low, the control unit 230 connects the secondary battery 110 to the charging unit 220 by turning on the third and fourth switches SW3 and SW4, to apply a charging current to the secondary battery 110. Then, the charging unit 220 applies a charging current to the secondary battery 110.

In still another example, during operation of the load 210, the control unit 230 connects the secondary battery 110 to the load 210, and when the operation of the load 210 is temporarily stopped, may connect the secondary battery 110 to the charging unit 220 to charge the secondary battery 110.

In these embodiments, the control unit 230 may control the charging unit 220 to allow a charging current supplied to the secondary battery 110 to have such a pattern that the charging current increases to a predetermined peak value and then decreases.

As an example, the control unit 230 may control the charging unit 220 to allow a magnitude of a charging current to gradually increase from zero to a predetermined peak value and then gradually decrease to zero.

As another example, the control unit 230 may control the charging unit 220 to allow a magnitude of a charging current to gradually increase from zero to a predetermined peak value and then gradually decrease to zero after a discharging current of the secondary battery 110 gradually decreases to zero.

As a typical example of the above embodiment, regeneration charging of an electric vehicle or a hybrid vehicle may be given. The regeneration charging refers to charging of a secondary battery using regeneration energy produced by a brake system when the vehicle slows down through brake manipulation. Because regeneration charging is made by brake manipulation, a discharging current of the secondary battery 110 gradually decreases to zero until regeneration charging starts. Also, during regeneration charging, a magnitude of a charging current gradually increases from zero to a predetermined peak value and then gradually decreases to zero. In this embodiment, the charging unit 230 is systemically associated with the brake system that produces regeneration energy, and may control an overall regeneration charging process. Because the regeneration charging technology is widely known in the technical field to which the present disclosure belongs, its detailed description is omitted herein.

The apparatus 100 for estimating the parameter is an apparatus that estimates a parameter indicating an electrochemical property changing during charging or discharging of the secondary battery 110, such as an open-circuit voltage or a SOC of the secondary battery 110, and includes a sensor means 120 and a control means 130.

The sensor means 120 measures a magnitude of a charging current and a secondary battery voltage and provides the measurements to the control means 130 while the charging current is being supplied from the charging unit 220 to the side of the secondary battery 110.

The sensor means 120 may receive a measurement control signal from the control means 130 to measure a current and a voltage of the secondary battery while a charging current flows. That is, the sensor means 120 measures a current and a voltage of the secondary battery and provides the same to the control means 130 each time the measurement control signal is received.

According to one example, while a magnitude of the charging current increases from zero to a predetermined peak value and then decreases to zero, the sensor means 120 measures the magnitude of the charging current and a voltage of the secondary battery 110 and supplies the same to the control means 130 repeatedly multiple times at a time interval while the charging current decreases from the predetermined peak value to zero.

According to another example, while the magnitude of the charging current increases from zero to the predetermined peak value and then decreases to zero, the sensor means 120 measures the magnitude of the charging current and the voltage of the secondary battery 110 and supplies the same to the control means 130 repeatedly multiple times at a time interval.

Hereinafter, for convenience of description, a magnitude of a charging current and a voltage of the secondary battery 110 measured at any point in time is referred to as current-voltage data.

In the above examples, because the magnitude of the charging current and the voltage of the secondary battery 110 are measured multiple times, the control means 130 receives a plurality of current-voltage data from the sensor means 120.

In one aspect, the sensor means 120 may measure a magnitude of a charging current and a voltage of the secondary battery 110 multiple times after an operation mode of the secondary battery 110 changes from a discharging mode to a charging mode. In this case, after a discharging current of the secondary battery 110 gradually decreases to zero, the sensor means 120 may measure current-voltage data.

In the above examples, the sensor means 120 may measure a current and a voltage of the secondary battery 110 multiple times after a magnitude of a charging current decreases to $1/3$ or less, preferably, $1/6$ or less, based on a peak value. Also, because the decrease ratios are just an example, it is possible to change to different numeric values.

The plurality of current-voltage data is used to estimate an open-circuit voltage and a SOC of the secondary battery 110, and because current-voltage data measured under the above measurement condition is obtained in such a state that polarization accumulation of the secondary battery 110 is reduced, reliability of an open-circuit voltage and a SOC estimated according to the present disclosure may be improved.

The control means 130 controls operation of the sensor means 120. That is, the control means 130 may transmit a measurement control signal to the sensor means 120 multiple times to measure a current and a voltage of the secondary battery 110 multiple times during charging of the secondary battery 110. Also, when the sensor means 120 measures a current and a voltage of the secondary battery 110 in response to the measurement control signal and provides the same to the control means 130, thereby the control means 130 receiving the current-voltage data measured at a present stage.

After the control means 130 receives the plurality of current-voltage data, the control means 130 calculates a linear approximation equation ($V=a*I+b$) representing a correlation between the current and the voltage using the received current-voltage data.

Here, an input variable I and an output variable V of the linear approximation equation denote a current and a voltage of the secondary battery 110, respectively, a slope 'a' denotes a resistance characteristic, a Y intercept 'b' denotes a voltage when a current of the secondary battery is zero, that is, an open-circuit voltage. Accordingly, when the linear approximation equation is calculated, the Y intercept may be estimated as an open-circuit voltage of the secondary battery.

A number of current-voltage data used when calculating the linear approximation equation is preferably at least two. Also, to estimate an open-circuit voltage more correctly, increasing a number of current-voltage data to at least three is not particularly limited.

Also, when a point in time at which a magnitude of a charging current reaches a peak value is $T_p$ and a point in time at which the magnitude of the charging current decreases from the peak value to zero is $T_0$, it is preferred to select a time to measure current-voltage data used when calculating the linear approximation equation as near $T_0$ as possible. This is because as the time to measure current-voltage data is closer to $T_0$, polarization accumulation of the secondary battery 110 is reduced, consequently, the Y intercept of the linear approximation equation comes closer to an open-circuit voltage of the secondary battery 110.

As an example, the control means 130 acquires interpolation data used to calculate a linear approximation equation by selecting at least two current-voltage data measured after a magnitude of a charging current decreases to $1/3$ or less, preferably, $1/6$ or less based on a peak value, among the plurality of current-voltage data received from the sensor means 120. This method is characterized in that at least two current-voltage data used to calculate a linear approximation equation are sampled among the plurality of current-voltage data provided from the sensor means 120. The control unit 130 may calculate a linear approximation equation using the interpolation data acquired by the above method.

As another example, the control means 130 may receive at least two current-voltage data used to calculate a linear approximation equation from the sensor means 120 by outputting a measurement control signal to the sensor means 120 periodically, after a magnitude of a charging current flowing to the secondary battery 110 decreases to $1/3$ or less, preferably, $1/6$ or less based on a peak value, to acquire a preset number of current-voltage data through the sensor means 120. The received at least two current-voltage data constitute interpolation data used to calculate a linear approximation equation. This method is characterized in that the control means 130 directly measures, by use of the sensor means 120, a plurality of current-voltage data used to calculate a linear approximation equation, dissimilar to the sampling method described in the foregoing. The control means 130 may calculate a linear approximation equation using the interpolation data acquired by the above method.

After the control means 130 calculates the linear approximation equation, the control means 130 may estimate a Y intercept of the calculated linear approximation equation as an open-circuit voltage of the secondary battery 110.

Optionally, the control means 130 may further estimate a SOC of the secondary battery corresponding to the estimated open-circuit voltage using a predefined lookup table or lookup function that predefines a correlation between an open-circuit voltage and a SOC.

Here, the lookup table is made by measuring a SOC for each open-circuit voltage of the secondary battery 110 through an experiment, and organizing the measurement results in a form of a table. In the lookup table, a SOC of the secondary battery 110 may be estimated in a simple manner by mapping the estimated open-circuit voltage to a corresponding SOC.

The lookup function is presented by measuring a SOC for each open-circuit voltage of the secondary battery 110 through an experiment, and defining a profile of the measured SOCs for each open-circuit voltage as a function. An input variable and an output variable of the lookup function are an open-circuit voltage and a SOC, respectively. When an estimated open-circuit voltage is substituted as an input variable of the lookup function, a SOC may be obtained as an output value of the lookup function.

Meanwhile, a SOC of the secondary battery 110 has dependency on temperature.

Accordingly, a temperature parameter may be further added to the lookup table and the lookup function. That is, through an experiment, the lookup table and the lookup function may be prepared for each temperature. In this case, when a charging current flows to the secondary battery 110, the sensor means 120 may further measure a temperature of the secondary battery 110 and provide the temperature of the secondary battery 110 to the control means 130. Then, the control means 130 may identify a lookup table or lookup function corresponding to the temperature of the secondary battery 110, and may estimate a SOC of the secondary battery 110 corresponding to the estimated open-circuit voltage using the identified lookup table or lookup function.

On the other hand, during dynamic charging of the secondary battery, a voltage measured between the cathode and the anode may include a voltage component originating from accumulation of polarization in the cathode and the anode.

Accordingly, in case the Y intercept of the linear approximation equation is corrected in consideration of the voltage component by polarization, the open-circuit voltage of the secondary battery may be estimated more correctly.

The apparatus 100 for estimating the parameter of the secondary battery may further include a storage means 160. The storage means 160 is not limited to a specific type if it is a storage medium capable of recording and erasing information.

For example, the storage means 160 may be random access memory (RAM), read-only memory (ROM), a register, a hard disc, an optical recording medium, or a magnetic recording medium. Also, the storage means 160 may be connected to the control means 130 via, for example, a data bus, to allow access by the control means 130.

The storage mans 160 may store and/or update and/or erase and/or transmit programs including various control logics executed by the control means 130, and/or data generated by execution of the control logics.

As a non-limiting example, the storage mans 160 may be logically divided into at least two, and may be included in the control means 130.

The storage mans 160 may maintain the plurality of current-voltage data measured by the sensor means 120, the interpolation data including the at least two current-voltage data used in calculating the linear approximation equation, or the parameter (the open-circuit voltage and/or the SOC) estimated using the linear approximation equation.

To execute various control logics and/or calculation logics, the control mans 130 may optionally include a processor, an application-specific integrated circuit (ASIC), a chipset, a logic circuit, a register, a communication modem, and a data processing device, well known in the art. Also, when a control logic is implemented in software, the control means 130 may be implemented as an assembly of program modules. In this instance, the program module may be stored in a memory and executed by a processor. The memory may be disposed inside or outside a processor, and may be connected to a processor by various known means. Also, the memory may be included in the storage means 160. Also, the memory generally represents all devices storing information regardless of a device type, and does not indicate a specific memory device.

Optionally, the apparatus 100 for estimating the parameter of the secondary battery may further include a display means 150. The display means 150 is not limited to a specific type if it can display information about the open-circuit voltage and/or the SOC of the secondary battery 110 estimated by the control means 130 as graphical interface (a character, a number, a graph, and the like).

As an example, the display means 150 may be a liquid crystal display (LCD), a light-emitting diode (LED) display, an organic light-emitting diode (OLED) display, an electrophoretic ink (E-Ink) display, a flexible display, and the like.

The display means 150 may be connected with the control means 130 directly or indirectly. When the latter is employed, the display means 150 may be located in a physically separate area from an area where the control means 130 is located. Also, a third control means (not shown) may be interposed between the display means 150 and the control means 130 to receive information to be displayed on the display means 150 from the control means 130 and allow the information to be displayed on the display means 150. For this, the third control means may be connected to the control means 130 via a communication line (for example, a CAN communication network in a vehicle).

The display means 150 is not necessarily included in the apparatus according to the present disclosure, and may be included in other apparatus connected with the apparatus according to the present disclosure. In this case, the display means 150 and the control means 130 may be indirectly connected via a control means included in other apparatus rather than being directly connected. Accordingly, it should be understood that an electrical connection of the display means 150 and the control means 130 includes this indirect connection method.

The control means 130 may form a communication interface with an external control device. Also, through the communication interface, data associated with the open-circuit voltage and/or the SOC of the secondary battery 110 may be transmitted to the external control means. The external control means may be a control unit 230 of the electric-powered device 200.

For example, in the case where the secondary battery 110 is mounted in an electric vehicle, the control means 130 may transmit data associated with the open-circuit voltage and/or the SOC of the secondary battery 110 to the control unit 230 that controls an operating mechanism of the electric vehicle in an integrated manner. Then, the control unit 230 may control the charge and discharge of the secondary battery 110 using the received open-circuit voltage and/or SOC of the secondary battery 110, and maximize the usage efficiency of the secondary battery 110.

In the present disclosure, the secondary battery 110 includes a cathode active material and an anode active material, and the cathode active material may be a single cathode material or a blended cathode material including at least two cathode materials.

In the latter case, the blended cathode material may include a first cathode material and a second cathode material, each of which having a different reaction concentration with working ions depending on a voltage of the secondary battery or different operating voltage ranges.

According to one aspect, the first cathode material may be an alkali metal compound represented by a general chemical formula $A[A_xM_y]O_{2+z}$ (A includes at least one of Li, Na, and K; M includes at least one element selected from Ni, Co, Mn, Ca, Mg, Al, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; a stoichiometric coefficient x, y, z, and a stoichiometric coefficient of an element included in M is selected such that a compound maintains electrical neutrality), or an alkali metal compound, disclosed in U.S. Pat. No. 6,677,082 and U.S. Pat. No. 6,680,143, $xLiM^1O_2-(1-x)Li_2M^2O_3$ ($M^1$ includes at least one element having an average oxidation state equal to 3; $M^2$ includes at least one element having an average oxidation state equal to 4; $0 \leq x \leq 1$).

According to another aspect, the second cathode material may be lithium metal phosphate represented by a general chemical formula $Li_aM_x^1Fe_{1-x}M_y^2P_{1-y}M_z^3O_{4-z}$ ($M^1$ includes at least one element selected from Ti, Si, Mn, Co, Fe, V, Cr, Mo, Ni, Nd, Al, Mg, and Al; $M^2$ includes at least one element selected from Ti, Si, Mn, Co, Fe, V, Cr, Mo, Ni, Nd, Al, Mg, Al, As, Sb, Si, Ge, V, and S; $M^3$ includes at least one element selected from elements in a halogen family including F; $0 < a \leq 2$, $0 \leq x \leq 1$, $0 \leq y < 1$, $0 \leq z < 1$; a stoichiometric coefficient a, x, y, z, and a stoichiometric coefficient of an element included in $M^1$, $M^2$, and $M^3$ is selected such that a compound maintains electrical neutrality) or $Li_3M_2(PO_4)_3$ [M includes at least one element selected from Ti, Si, Mn, Fe, Co, V, Cr, Mo, Ni, Mg, and Al].

According to still another aspect, the first cathode material may be $Li[Li_aNi_bCo_cMn_d]O_{2+z}$ [$a \geq 0$; $a+b+c+d=1$; at least one of b, c and d is not zero; $-0.1 \leq z \leq 2$], and the second cathode material may be $LiFePO_4$, $LiMn_xFe_yPO_4$ ($0 < x+y \leq 1$) or $Li_3Fe_2(PO_4)_3$.

According to yet another aspect, the first cathode material and/or the second cathode material may include a coating layer. The coating layer may include a carbon layer, or may include an oxide layer or a fluoride layer including at least one element selected from the group consisting of Ti, Si, Mn, Co, Fe, V, Cr, Mo, Ni, Nd, Al, Mg, Al, As, Sb, Si, Ge, V, and S.

In the present disclosure, a type and a blend ratio of the first cathode material and the second cathode material is selected such that a convex pattern (an inflection point is present before and after a peak) appears in a discharge resistance profile measured for each SOC of the secondary battery 110, or at least one inflection point appears in an open-circuit profile measured for each depth of discharge (DOD) of the secondary battery 110, while considering a capacity and performance of a secondary battery intended to manufacture.

In one embodiment, in the case where a secondary battery with high discharge output is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 5:5.

In another embodiment, in the case where a secondary battery with high-temperature stability is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 2:8.

In still another embodiment, in the case where a low cost secondary battery is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 1:9.

In yet another embodiment, in the case where a secondary battery with high discharge output and high-temperature stability is desired, $[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 4:6.

In further another embodiment, in the case where a secondary battery with high capacity per weight is desired, $Li[Ni_{0.5}Mn_{0.3}Co_{0.2}]O_2$ and $LiFePO_4$ may be selected as the first cathode material and the second cathode material, respectively, and a blend ratio of the first cathode material and the second cathode material may be set to 9:1.

Methods of selecting the first cathode material and the second cathode material and adjusting the blend ratio are just one example. Accordingly, it is obvious to a person having ordinary skill in the art that the first cathode material and the second cathode material and the blend ratio thereof may be properly selected in consideration of a relative weight and balance of electrochemical properties with which a blended cathode material is characterized.

In the present disclosure, a number of cathode materials that may be included in the blended cathode material are not limited to two. As one embodiment, the blended cathode material may include three different cathode materials, for example, a blended cathode material including $LiMn_2O_4$, $Li[Li_aNi_xCo_yMn_zO_2[a \geq 0; x+y+z=1;$ at least one of x, y, and z is not zero], and $LiFePO_4$. As another embodiment, the blended cathode material may include four different cathode materials, for example, a blended cathode material including $LiNiO_2$, $LiMn_2O_4$, $Li[Li_aNi_xCo_yMn_z]O_2[a \geq 0; x+y+z=1;$ at least one of x, y, and z is not zero], and $LiFePO_4$.

Also, to enhance the properties of the blended cathode material, other additives, for example, a conductive material, a binder, and the like, may be added to the blended cathode material, and there is no particular limitation thereto. Accordingly, any blended cathode material including at least two cathode materials may be construed as being included in the scope of the present disclosure regardless of a number of cathode materials and the presence of other additives.

In the description of various embodiments of the present disclosure, it should be understood that elements called 'means' are distinguished functionally rather than physically. Accordingly, each element may be selectively integrated with other element, or each element may be divided into sub-elements for efficient execution of the control logic(s). However, it is obvious to a person having ordinary skill in the art that even though elements are integrated or divided, if functions are found to be identical, the integrated or divided elements should be construed as falling within the scope of the present disclosure.

A selective combination of at least one of the various control logics and/or calculation logics of the control means 130 may become an embodiment of a method for estimating the parameter of the secondary battery.

Figure 2:
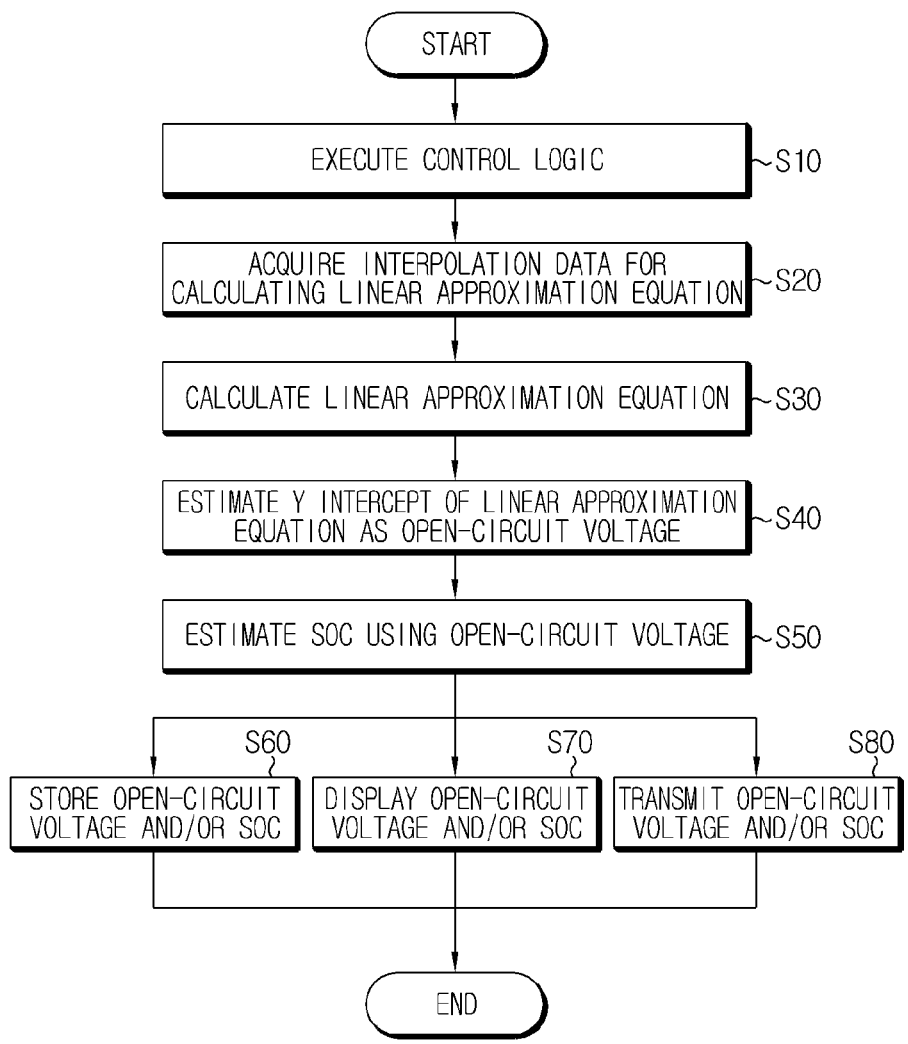
FIG. 2 is a flowchart chronologically illustrating a method for estimating a parameter of a secondary battery according to an exemplary embodiment of the present disclosure.

FIG. 2 is a flowchart chronologically illustrating a method for estimating a parameter of a secondary battery according to an exemplary embodiment of the present disclosure.

First, in S10, the control means 130 reads a control logic needed to estimate a parameter of a secondary battery from the storage means 160 and executes the control logic.

Subsequently, in S20, the control means 130 acquires at least two current-voltage data (interpolation data) used to calculate a linear approximation equation by controlling the sensor means 120 while the secondary battery is temporarily being charged in such a pattern that a charging current increases to a peak value and then reduces.

Preferably, in order to acquire current-voltage data measured when polarization accumulation of the secondary battery 110 is reduced, the control means 130 acquires at least two current-voltage data (interpolation data) used to calculate a linear approximation equation by controlling the sensor means 120, when a discharging current of the secondary battery 110 in a discharged state gradually decreases to zero and the secondary battery 110 is switched to a charging mode.

Here, the control means 130 acquires interpolation data by a sampling method or a direction measurement method. Its detailed description is provided above.

Preferably, current-voltage data included in the interpolation data may be current-voltage data measured while a magnitude of a charging current decreases from a peak value to zero.

As an example, current-voltage data included in the interpolation data may be current-voltage data measured after a magnitude of a charging current decreases to 1/3 or less, preferably, 1/6 or less, based on a peak value. Also, a magnitude condition of a charging current under which the current-voltage data is measured may change based on a type or performance of the secondary battery.

Next, in S30, the control means 130 calculates a linear approximation equation using the interpolation data. Subsequently, in S40, the control means 130 estimates a Y intercept of the linear approximation equation as an open-circuit voltage of the secondary battery. Subsequently, in S50, the control means 130 may further estimate a SOC of the secondary battery 110 from the estimated open-circuit voltage. The SOC of the secondary battery 110 may be calculated using a lookup table or a lookup function, as described in the foregoing.

In the case where a temperature of the secondary battery 110 is taken into consideration when estimating the SOC of the secondary battery 110, the flowchart of FIG. 2 may further include a step in which the control means 130 acquires data associated with the temperature of the secondary battery 110 using the sensor means 120 during charging of the secondary battery 110. In the case where the temperature of the secondary battery 110 is considered, a detailed description of operation of the control means 130 is provided above.

Also, the flowchart of FIG. 2 may further include, as an optional step, at least one step among steps S60 through S80.

That is, in S60, the control means 130 may record the estimated open-circuit voltage and/or the estimated SOC of the secondary battery 110 in the storage means 160. Also, in S70, the control means 130 may output the estimated open-circuit voltage and/or the estimated SOC of the secondary battery 110 as graphical interface (a character, a number, a graph, and the like) through the display means 150. Also, the control means 130 may transmit the estimated open-circuit voltage and/or the estimated SOC of the secondary battery 110 to the control unit 230 of the electric-powered device 200.

In the present disclosure, at least one of various control logics and/or calculation logics of the control means 130 may be selectively combined, and the combined logics may be written in a computer-readable code and recorded in a computer-readable recording medium.

The recording medium is not limited to a specific type if it is accessible by a processor included in a computer. For example, the recording medium may include at least one selected from the group consisting of ROM, RAM, a register, a compact disc read-only memory (CD-ROM), a magnetic tape, a hard disc, a floppy disc, and an optical data recording device.

Also, the computer-readable code may be modulated to a carrier signal and included in a communication carrier at a particular point in time, and may be distributed over network-coupled computer systems so that the computer-readable code is stored and executed in a distributed fashion. Also, functional programs, codes, and code segments for implementing the combined control logics may be easily inferred by programmers in the technical field to which the present disclosure belongs.

MODE FOR EMBODIMENT OF THE INVENTION

Hereinafter, a detailed description is provided through an experiment example. However, the experiment is for illustrative of the present disclosure only, and the scope of the present disclosure is not limited thereto.

Experiment Example 1

Fabrication of Secondary Battery

A secondary battery including a single cathode material was fabricated in accordance with the following specification.

Cathode material: $LiCo_{1/3}Ni_{1/3}Mn_{1/3}O_2$
Anode material: Graphite
Electrolyte: $LiPF_6$ added to a mixed solvent of EC(Ethyl Carbonate)/DMC(DiMethyl Carbonate)/EMC(Ethyl-Methyl Carbonate) mixed at a weight ratio of 3:4:3
Separator: Porous polyolefin film coated with inorganic particles on both surfaces
Casing: Pouch casing
Charge/Discharge Experiment FIG. 3 is a graph illustrating measurement of a charging/discharging current profile and a voltage change of a secondary battery.

The charging/discharging current profile simulates a driving pattern in Los Angeles presented as vehicle testing standards in the U.S. hybrid vehicle industry under the assumption that the secondary battery is used in a hybrid vehicle.

In the charging/discharging current profile, an interval A is a period during which the secondary battery is discharged, an interval B is a period during which the secondary battery is charged, and an interval C is a period during which charge and discharge of the secondary battery is stopped. A charging current profile during the interval B simulates a situation in which the secondary battery is regeneration charged when the hybrid vehicle slows down. Accordingly, the charging current profile during the interval B has such a pattern that a magnitude of a charging current increases from zero to a predetermined peak value and then decreases to zero. An increase in charging current occurs when a brake is pushed, and a decrease in charging current occurs when a brake is pulled.

Figure 3:
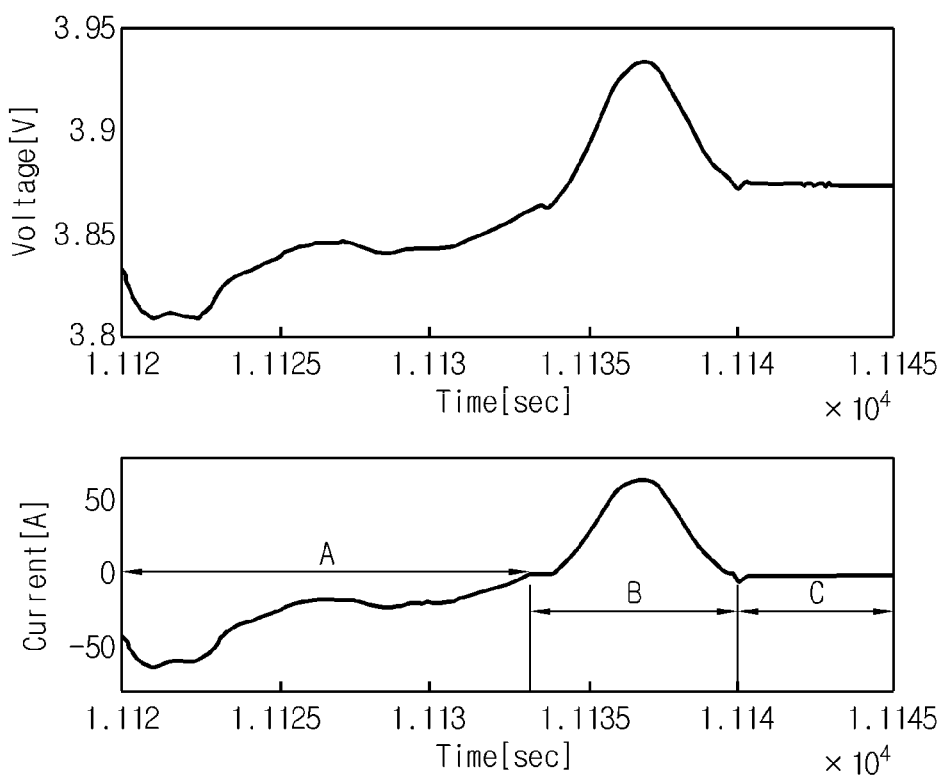
FIG. 3 is a graph illustrating measurement of a charging/discharging current profile and a voltage change of a secondary battery (experiment example 1).
Figure 4:
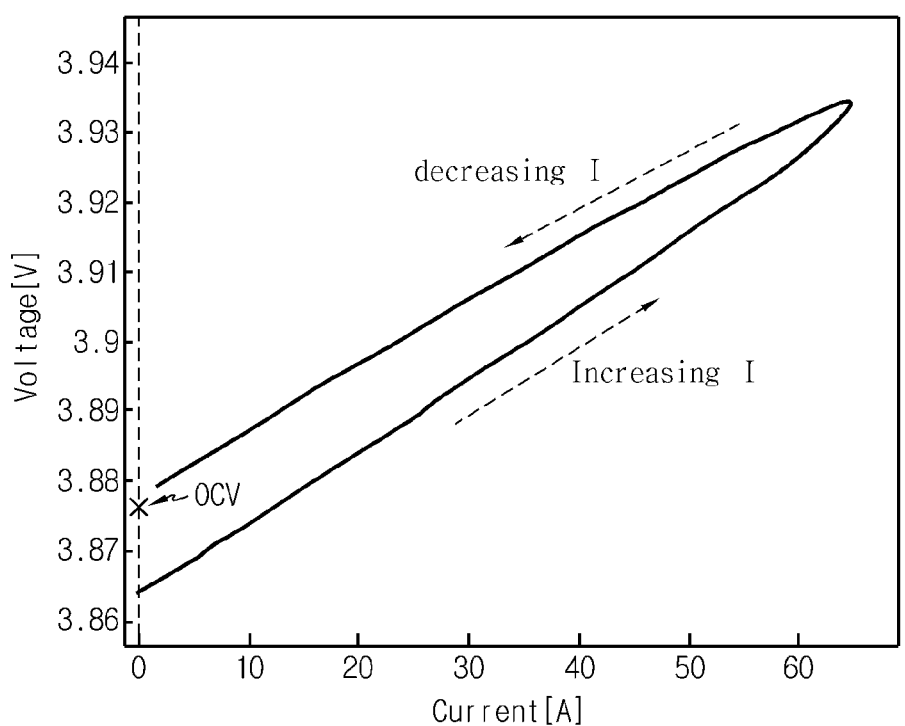
FIG. 4 is a graph plotting current-voltage data of a secondary battery measured during charging of the secondary battery (experiment example 1).

FIG. 4 is a graph plotting current-voltage data of the secondary battery measured during charging of the secondary battery for the interval B of FIG. 3. Referring to FIG. 4, current-voltage data is plotted as a profile having a form of a hysteresis loop, and it is found that current-voltage data measured for a period during which a magnitude of a charging current decreases from a peak value to zero approximates an actual open-circuit voltage (a point indicated by X) of the secondary battery.

Experiment Example 2

Fabrication of Secondary Battery

A secondary battery including a blended cathode material was fabricated in accordance with the following specification.

Cathode material: Blended cathode material of $LiCo_{1/3}Ni_{1/3}Mn_{1/3}O_2$ and $LiFePO_4$ at a weight ratio of 7:3

Anode material: Graphite

Electrolyte: $LiPF_6$ added to a mixed solvent of EC/DMC/EMC mixed at a weight ratio of 3:4:3

Separator: Porous polyolefin film coated with inorganic particles on both surfaces Casing: Pouch casing Observation of Characteristics of Secondary Battery During charging of the secondary battery, lithium ions deintercalated from the cathode material are intercalated into the anode material. However, $LiCo_{1/3}Ni_{1/3}Mn_{1/3}O_2$ and $LiFePO_4$ differ in concentration at which lithium ions are deintercalated as a charging voltage of the secondary battery changes. That is, for a low voltage charging period, lithium ions from $LiFePO_4$ are deintercalated, and for a high voltage charging period, lithium ions from $LiCo_{1/3}Ni_{1/3}Mn_{1/3}O_2$ are deintercalated. Accordingly, for an intermediate voltage period, a type of the cathode material from which lithium ions are deintercalated changes from $LiFePO_4$ to $LiCo_{1/3}Ni_{1/3}Mn_{1/3}O_2$.

It can be seen that occurrence of this phenomenon can be seen indirectly through an inflection point appearing in a voltage profile measured during charging of the secondary battery. The reason that the inflection point appears is that when a cathode material involved in a deintercalation reaction of lithium ions changes, an internal resistance of the secondary battery changes, as a result, even though a same magnitude of a charging current flows to the secondary battery, a voltage change width changes.

Figure 5:
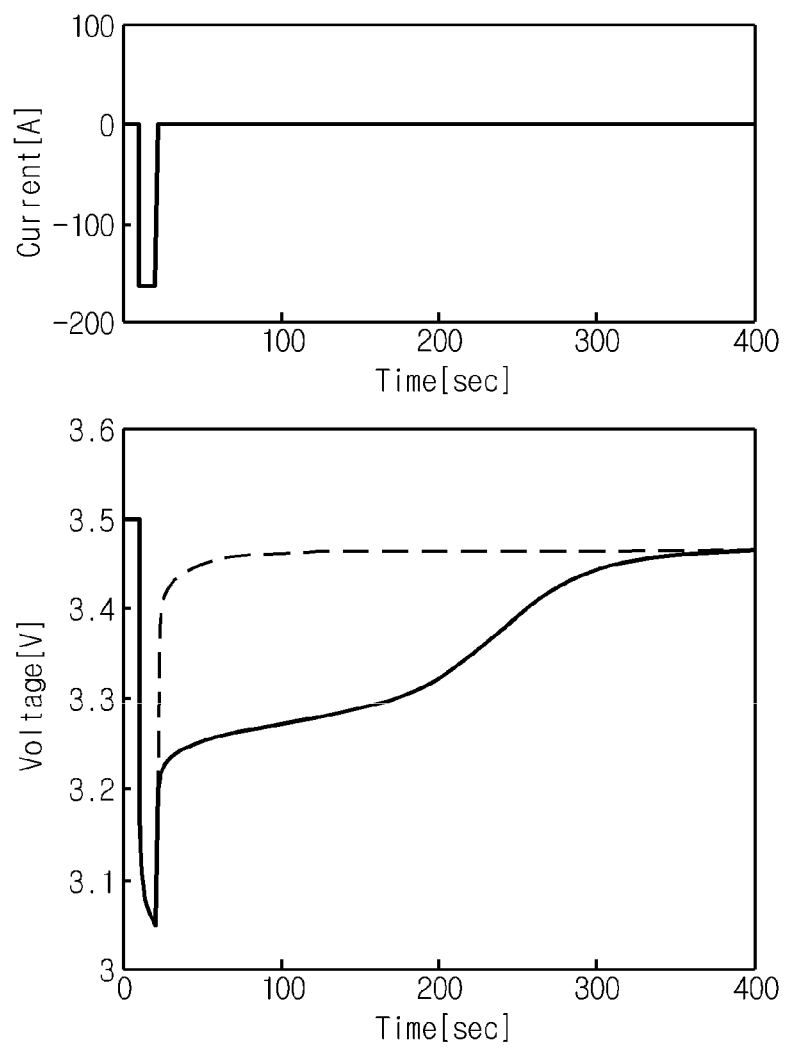
FIG. 5 is a graph illustrating measurement of a charging/discharging current profile and a voltage change profile of a secondary battery (experiment example 2).

FIG. 5 is a graph illustrating measurement of a charging/discharging current profile and a voltage change profile of the secondary battery.

Referring to the drawing, after the secondary battery is discharged for an interval between 10 sec and 20 sec, the secondary battery is charged with a constant current from 20 sec, and an inflection point (around 3.35V) is observed in a voltage profile measured from 20 sec. A dotted line profile is a voltage change profile of a secondary battery using only $LiCo_{1/3}Ni_{1/3}Mn_{1/3}O_2$ as a cathode material. The dotted line profile makes a great contrast with a solid line profile.

Around the inflection point, a voltage change rate changes suddenly. Accordingly, it can be seen that at a voltage range around the inflection point, a cathode material from which lithium ions are deintercalated changes from $LiFePO_4$ to $LiCo_{1/3}Ni_{1/3}Mn_{1/3}O_2$. The voltage range at which the inflection point appears may change based on a type and a blend ratio of cathode materials constituting the cathode material.

A secondary battery including a blended cathode material comprising at least two cathode materials exhibits a unique behavior in a discharge resistance profile and an open-circuit voltage profile.

Figure 6:
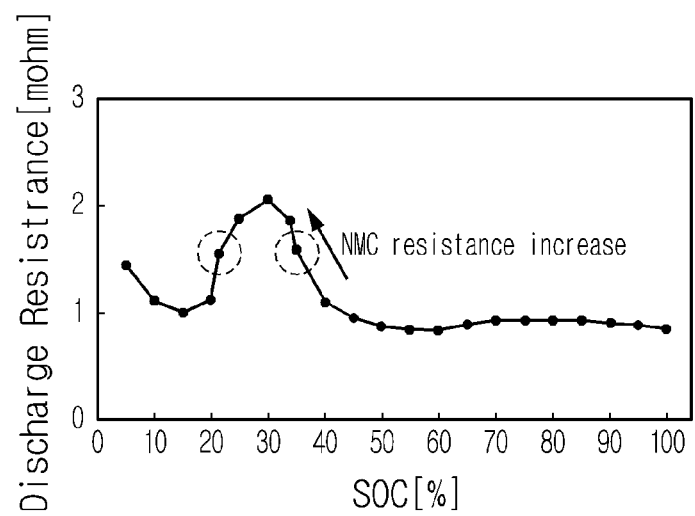
FIGS. 6 and 7 are graphs illustrating a discharge resistance profile of a secondary battery measured for each state of charge (SOC) of the secondary battery and an open-circuit voltage profile measured for each depth of discharge (DOD) of the secondary battery (experiment example 2).
Figure 7:
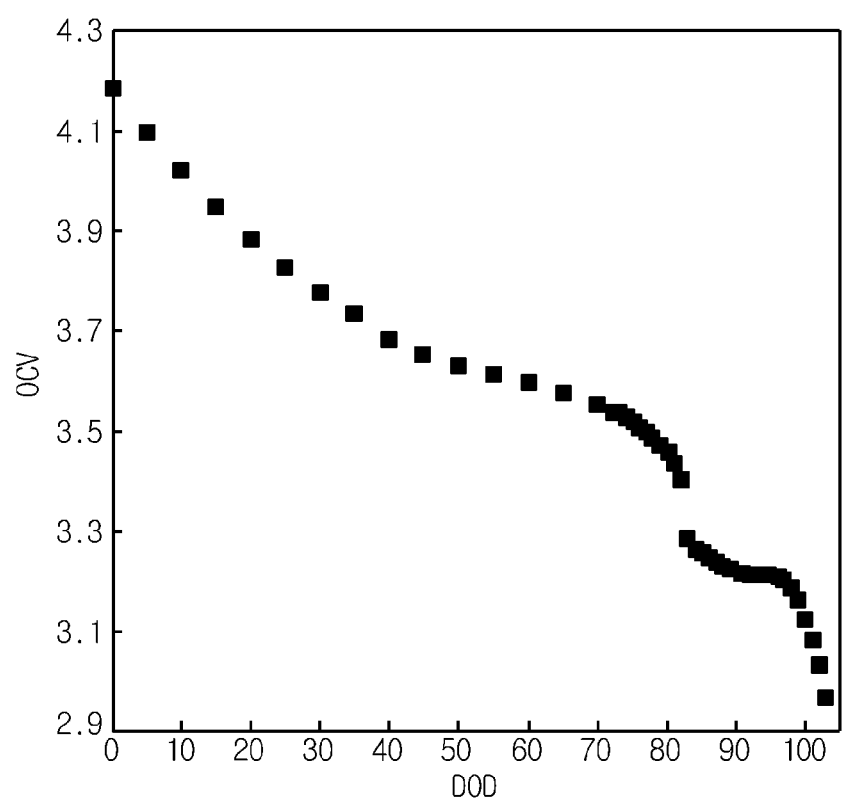

FIGS. 6 and 7 are graphs illustrating a discharge resistance profile of the secondary battery measured for each SOC of the secondary battery and an open-circuit voltage profile measured for each DOD of the secondary battery, respectively.

In the drawings, SOC stands for a state of charge, DOD stands for a depth of discharge, and numerically, DOD corresponds to (1-SOC).

Referring to FIG. 6, it can be observed that a convex pattern in which an internal resistance of the secondary battery locally increases and then decreases appears, and two inflection points (see dotted circles) are present before and after a peak of the convex pattern. Also, referring to FIG. 7, an inflection point is also observed in an open-circuit voltage profile.

As shown, the reason that the convex pattern and the inflection point are observed in the discharge resistance profile and the open-circuit voltage profile, respectively, is that internal resistance characteristics of the secondary battery change with a change in type of a cathode material from which lithium ions are deintercalated when the secondary battery is charged.

Charge/Discharge Experiment

Figure 8:
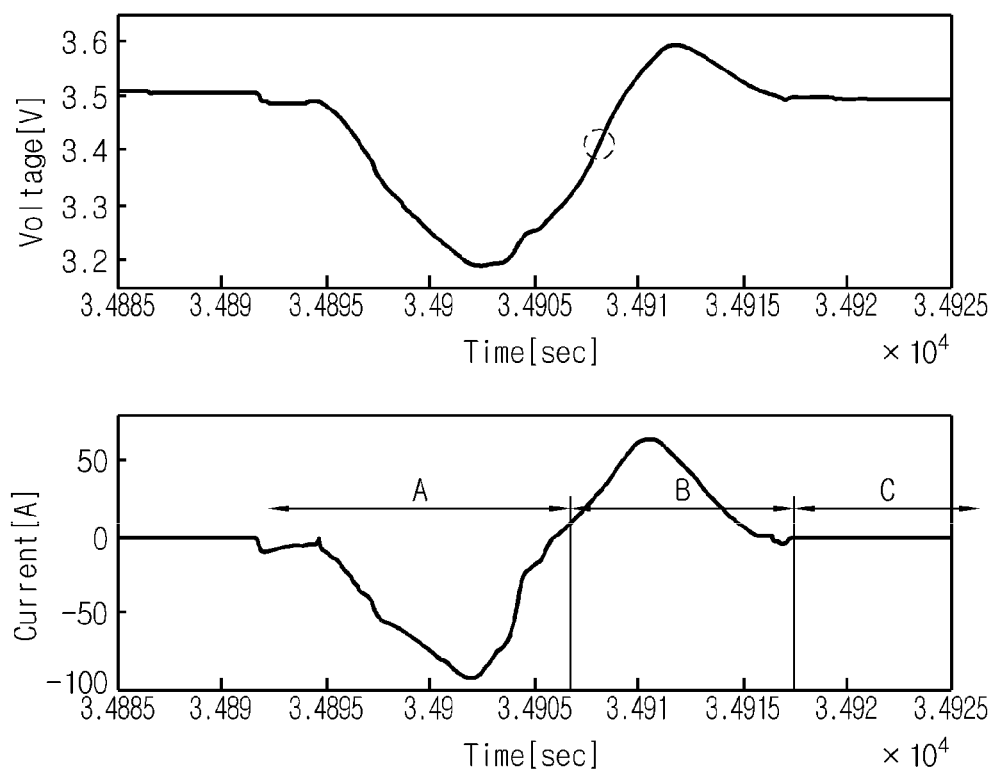
FIG. 8 is a graph illustrating measurement of a charging/discharging current profile of a secondary including a blended cathode material and a voltage change of the secondary battery (experiment example 2).

FIG. 8 is a graph illustrating measurement of a charging/discharging current profile of a secondary including a blended cathode material and a voltage change of the secondary battery.

The charging/discharging current profile simulates a driving pattern in Los Angeles presented as vehicle testing standards in the U.S. hybrid vehicle industry under the assumption that the secondary battery is used in a hybrid vehicle.

In the charging/discharging current profile, an interval A is a period during which the secondary battery is discharged, an interval B is a period during which the secondary battery is charged, and an interval C is a rest period during which charge and discharge of the secondary battery is stopped. A charging current profile during the interval B simulates a situation in which the secondary battery is regeneration charged when the hybrid vehicle slows down. Accordingly, the charging current profile during the interval B has such a pattern that a magnitude a charging current increases from zero to a predetermined peak value and then decreases to zero.

Referring to the voltage change of FIG. 8, an inflection point (dotted circle) is observed in a voltage profile of the secondary battery corresponding to the interval B. Accordingly, it is found that during charging for the interval B, a cathode material from which lithium ions are deintercalated changes from $LiFePO_4$ to $LiCo_{1/3}Ni_{1/3}Mn_{1/3}O_2$ around the inflection point.

Figure 9:
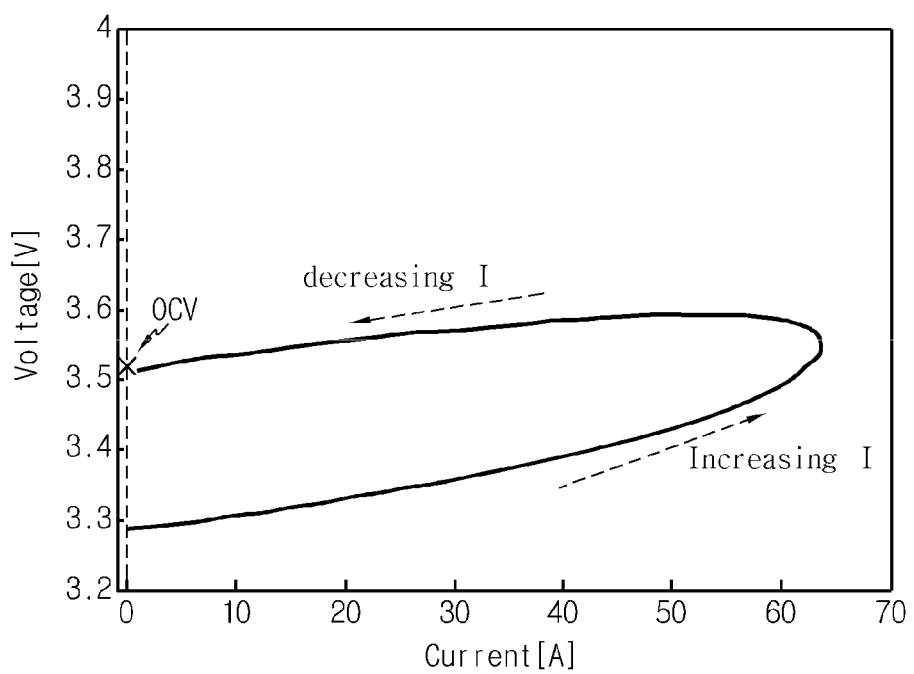
FIG. 9 is a graph plotting current-voltage data of a secondary battery including a blended cathode material measured during charging of the secondary battery for an interval B (experiment example 2).

FIG. 9 is a graph plotting current-voltage data of the secondary battery including the blended cathode material measured during charging of the secondary battery for the interval B. Referring to FIG. 9, current-voltage data is plotted as a profile having a form of a hysteresis loop, and it is found that current-voltage data measured for a period during which a magnitude of a charging current decreases from a peak value to zero approximately converges to an actual open-circuit voltage (a point indicated by X) of the secondary battery. This experiment result is the same as the experiment result of a secondary battery including a single cathode material.

Experiment Example 3

In this experiment, a difference between an estimated SOC of the secondary battery fabricated in Experiment example 1 using the present disclosure and an actually measured SOC of the secondary battery was measured.

Figure 10:
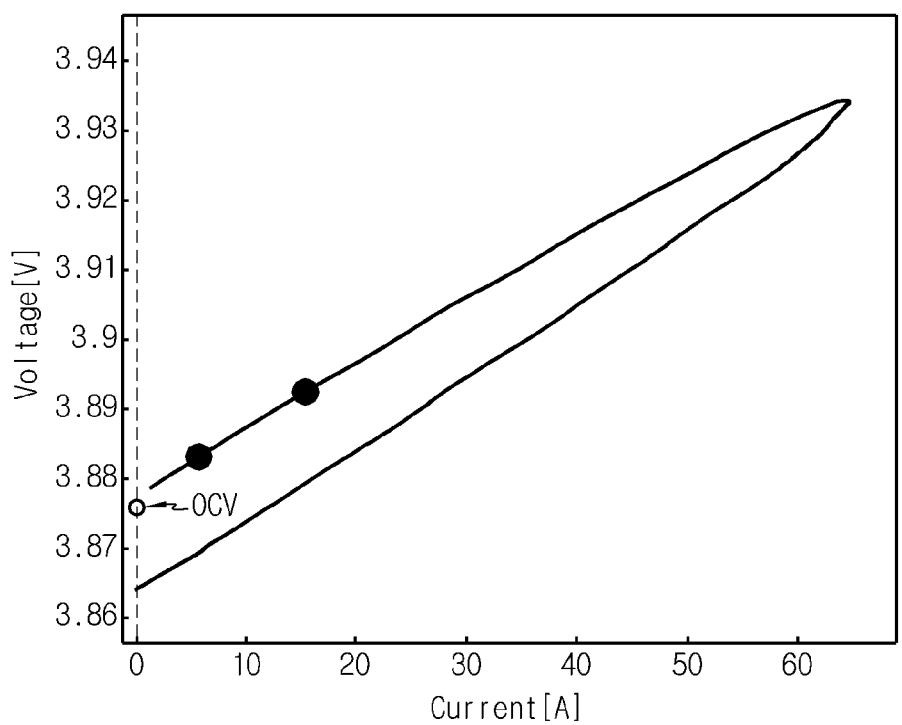
FIG. 10 is a graph illustrating two current-voltage data (interpolation data) used when calculating a linear approximation equation, indicated on a current-voltage profile.

FIG. 10 is a graph illustrating two current-voltage data (interpolation data) used when calculating a linear approximation equation, indicated on a current-voltage profile. One is data measured when a magnitude of a charging current decreases from a peak value to 15A, and the other is data measured when a magnitude of a charging current decreases from a peak value to 5A. The current-voltage data constituting the interpolation data is all data measured when a magnitude of a charging current decreases to ⅓ (20 ampere) or less, based on a peak value (65 ampere).

Figure 11:
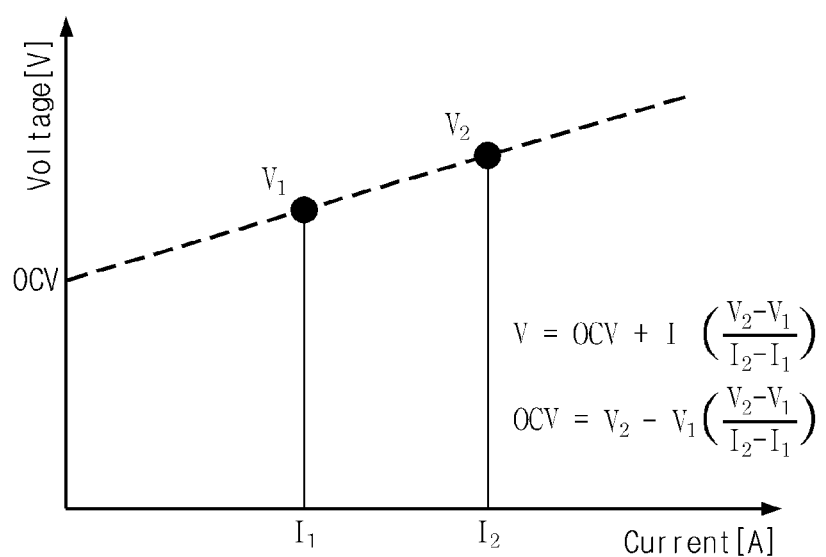
FIG. 11 is a graph illustrating a concept of estimating a Y intercept as an open-circuit voltage of a secondary battery when calculating a linear approximation equation using two current-voltage data.

FIG. 11 is a graph illustrating a concept of estimating a Y intercept as an open-circuit voltage of a secondary battery when calculating a linear approximation equation using two current-voltage data.

Figure 12:
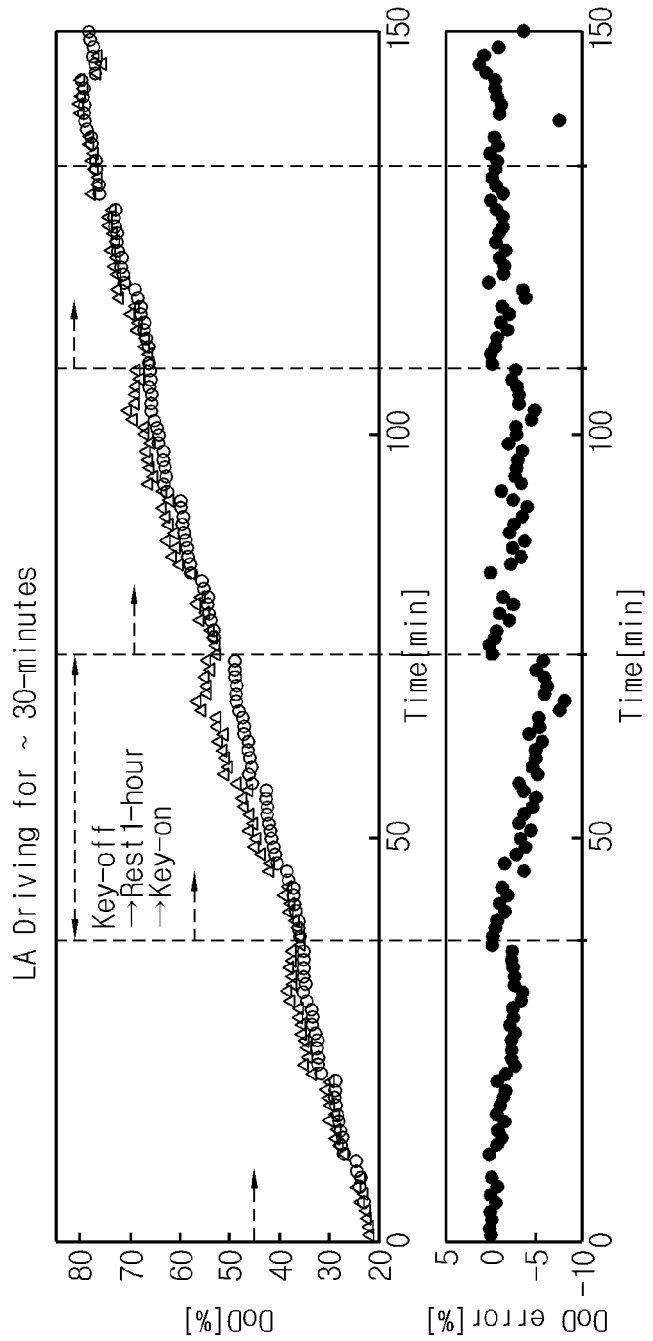
FIG. 12 is a graph illustrating a result of evaluating an accuracy in estimating a SOC using the present disclosure during regeneration charging of a secondary battery when the secondary battery is discharged (traveling) and regeneration charged (braking for stop) in a driving pattern simulating driving in Los Angeles.

FIG. 12 is a graph illustrating a result of evaluating an accuracy in estimating a SOC using the present disclosure during regeneration charging of a secondary battery while the secondary battery repeats a process of discharging (traveling) and regeneration charging (braking for stop) for a predetermined time in a driving pattern simulating driving in Los Angeles.

When estimating a SOC of a secondary battery, the SOC of the secondary battery is estimated in a manner of sampling two current-voltage data by applying the condition shown in FIG. 10 during regeneration charging of the secondary battery, calculating a Y intercept of a linear approximation equation using the sampled data, estimating the Y intercept as an open-circuit voltage of the secondary battery, and mapping the estimated open-circuit voltage to a corresponding SOC by referring to a lookup table that predefines SOCs for each open-circuit voltage.

In FIG. 12, a horizontal axis represents a time (min), and a vertical axis represents a DOD. Because a DOD corresponds to (1-SOC), FIG. 12 may be said to show a result of measuring a SOC.

FIG. 12 shows two profiles; a profile indicated by triangles shows a change in estimated SOC according to the present disclosure, and a profile indicated by circles shows a change in actual SOC.

In FIG. 12, four time lines (vertical dotted lines) are indicated, and a secondary battery is at rest (not discharging and not regeneration charging) for 1 hour at points at which each time line is indicated.

Referring to FIG. 12, it can be seen that a SOC of a secondary battery estimated by the present disclosure follows an actual SOC well, and an error is less than or equal to 5%.

In case a SOC of a secondary battery is estimated through Ampere counting, an error of current counting is accumulated over time, whereas the present disclosure is found to estimate a SOC of a secondary battery within an error range of 5% quite accurately without accumulation of errors.

The above experimental results support that the apparatus and method for estimating a parameter of a secondary battery according to the present disclosure may estimate an open-circuit voltage and/or a SOC of a secondary battery conveniently and accurately even in a dynamic charging and discharging situation of the secondary battery.

Hereinabove, the present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating an electrical parameter, the apparatus comprising:
   a secondary battery;
   a sensor configured to measure a plurality of current-voltage data while a charging current decreases when the secondary battery is charged in such a pattern that the charging current increases to a peak value and then decreases to less than a fraction of the peak value;
   a transceiver;
   a controller configured to:
   receive an input of the plurality of current-voltage data from the sensor,
   calculate a linear approximation equation, below:

$$V=a*I+b,$$

where V is an output voltage of the secondary battery, I is an input current of the secondary battery, a is a resistance characteristic, and b is the output voltage when the input current of the secondary battery is zero,
   wherein the linear approximation equation represents a correlation between the input current and the output voltage from the plurality of current-voltage data measured by the sensor after the charging current decreases to less than the fraction of the peak value, and
   estimate a Y intercept of the linear approximation equation as an open-circuit voltage of the secondary battery, and then estimate a state of charge (SOC) of the secondary battery from the estimated open-circuit voltage; and
   a storage configured to store the estimated open-circuit voltage and the estimated SOC,
   the controller further configured to control the transceiver to transmit the estimated open-circuit voltage and the estimated SOC to an external controller that charges and discharges the secondary battery using the estimated open-circuit voltage and the estimated SOC of the secondary battery to maximize the usage efficiency of the secondary battery.

2. The apparatus for estimating the electrical parameter according to claim 1, wherein the sensor is configured to measure the plurality of current-voltage data after the charging current decreases to ⅓ or less based on the peak value.

3. The apparatus for estimating the electrical parameter according to claim 2, wherein the sensor is configured to measure the plurality of current-voltage data after the charging current decreases to ⅙ or less based on the peak value.

4. The apparatus for estimating the electrical parameter according to claim 1, wherein the sensor is configured to measure the plurality of current-voltage data while a charging current decreases from a peak value to zero when the secondary battery is regeneration charged by a charging current profile in which the charging current increases from zero to the peak value and then decreases to zero.

5. The apparatus for estimating the electrical parameter according to claim 4, wherein the sensor is configured to measure the plurality of current-voltage data when the secondary battery is regeneration charged by the charging current profile after a discharging current of the secondary battery gradually decreases to zero.

6. The apparatus for estimating the electrical parameter according to claim 1, wherein the controller is configured to estimate an SOC corresponding to the estimated open-circuit voltage using a lookup table or a lookup function that defines a correlation between an open-circuit voltage and an SOC.

7. The apparatus for estimating the electrical parameter according to claim 1, wherein the sensor is configured to measure a temperature of the secondary battery and provides the measured temperature to the controller, and
the controller configured to estimate an SOC corresponding to the temperature of the secondary battery and the estimated open-circuit voltage using a lookup table or a lookup function that defines a correlation between an open-circuit voltage, voltage and a temperature and an SOC.

8. The apparatus for estimating the electrical parameter according to claim 1, wherein the secondary battery includes a blended cathode material in which at least two cathode materials are blended, and
wherein a blend ratio of a first of the two cathode materials and a second of the two cathode materials is selected such that a convex pattern, for which an inflection point is present before and after a peak, appears in a discharge resistance profile measured for each SOC of the secondary battery, or at least one inflection point appears in an open-circuit profile measured for each depth of discharge (DOD) of the secondary battery.

9. An electric-powered device comprising the apparatus defined in claim 1.

10. An apparatus for estimating an electrical parameter, the apparatus comprising:
a secondary battery;
a sensor configured to measure current-voltage data repeatedly at a time interval while the secondary battery is charged in such a pattern that the charging current increases to a peak value and then decreases to less than a fraction of the peak value;
a transceiver;
a controller configured to:
receive an input of the current-voltage data from the sensor,
identify a plurality of current-voltage data measured while the charging current decreases from the peak value,
calculate a linear approximation equation, below:

$V = a*I + b,$ where V is an output voltage of the secondary battery, I is an input current of the secondary battery, a is a resistance characteristic, and b is the output voltage when the input current of the secondary battery is zero,
wherein the linear approximation equation represents a correlation between the input current and the output voltage from the plurality of current-voltage data measured by the sensor after the charging current decreases to less than the fraction of the peak value, and
estimate, by the controller, a Y intercept of the linear approximation equation as an open-circuit voltage of the secondary battery, and then estimate a state of charge (SOC) of the secondary battery from the estimated open-circuit voltage; and
a storage configured to store the estimated open-circuit voltage and the estimated SOC,
the controller further configured to control the transceiver to transmit the estimated open-circuit voltage and the estimated SOC to an external controller that charges and discharges the secondary battery using the estimated open-circuit voltage and the estimated SOC of the secondary battery to maximize the usage efficiency of the secondary battery.

11. The apparatus for estimating the electrical parameter according to claim 10, wherein the sensor is configured to measure current-voltage data repeatedly at a time interval while a charging current decreases from a peak value to zero when the secondary battery is regeneration charged in such as pattern that the charging current increases from zero to the peak value and then decreases to zero.

12. The apparatus for estimating the electrical parameter according to claim 11, wherein the sensor is configured to measure current-voltage data repeatedly at a time interval when the secondary battery is regeneration charged after a discharging current of the secondary battery gradually decreases to zero.

13. The apparatus for estimating the electrical parameter according to claim 10, wherein the controller is configured to identify the plurality of current-voltage data among current-voltage data measured after a magnitude of the charging current decreases to ⅓ or less based on the peak value.

14. The apparatus for estimating the electrical parameter according to claim 10, wherein the controller is configured to identify the plurality of current-voltage data among current-voltage data measured after a magnitude of the charging current decreases to ⅙ or less based on the peak value.

15. The apparatus for estimating the electrical parameter according to claim 10, wherein the controller is configured to estimate an SOC corresponding to the estimated open-circuit voltage using a lookup table or a lookup function that defines a correlation between an open-circuit voltage and an SOC.

16. The apparatus for estimating the electrical parameter according to claim 10, wherein the sensor is configured to measure a temperature of the secondary battery and provide the measured temperature to the controller, and
the controller is configured to estimate an SOC corresponding to the temperature of the secondary battery and the estimated open-circuit voltage using a lookup table or a lookup function that defines a correlation between an open-circuit voltage, a temperature and an SOC.

17. The apparatus for estimating the electrical parameter according to claim 10, wherein the secondary battery includes a blended cathode material in which at least two cathode materials are blended, and
wherein a blend ratio of a first of the two cathode materials and a second of the two cathode materials is selected such that a convex pattern, for which an inflection point is present before and after a peak, appears in a discharge resistance profile measured for each SOC of the secondary battery, or at least one inflection point appears in an open-circuit profile measured for each depth of discharge (DOD) of the secondary battery.

18. A method for estimating an electrical parameter, the method comprising:
- measuring, by a sensor, a plurality of current-voltage data while a charging current decreases when a secondary battery is charged in such a pattern that the charging current increases to a peak value and then decreases to less than a fraction of the peak value;
- receiving, by a controller, an input of the plurality of current-voltage data from the sensor;
- calculating, by the controller, a linear approximation equation, below:

$$V=a*I+b,$$

where V is an output voltage of the secondary battery, I is an input current of the secondary battery, a is a resistance characteristic, and b is the output voltage when the input current of the secondary battery is zero,
- wherein the linear approximation equation represents a correlation between the input current and the output voltage from the plurality of measured current-voltage data measured by the sensor after the charging current decreases to less than the fraction of the peak value;
- estimating, by the controller, a Y intercept of the linear approximation equation as an open-circuit voltage of the secondary battery, and then estimating a state of charge (SOC) of the secondary battery from the estimated open-circuit voltage;
- storing, by the storage, the estimated open-circuit voltage and the estimated SOC; and
- transmitting, by the transceiver, the estimated open-circuit voltage and the estimated SOC to an external controller that charges and discharges the secondary battery using the estimated open-circuit voltage and the estimated SOC of the secondary battery to maximize the usage efficiency of the secondary battery.

19. The method for estimating the electrical parameter according to claim 18, further comprising:
- displaying the estimated open-circuit voltage.

20. The method for estimating the electrical parameter according to claim 18, further comprising:
- displaying the estimated SOC.

21. The method for estimating the electrical parameter according to claim 18, wherein the secondary battery includes a blended cathode material in which at least two cathode materials are blended, and
- wherein a blend ratio of a first of the two cathode materials and a second of the two cathode materials is selected such that a convex pattern, with an inflection point that is present before and after a peak, appears in a discharge resistance profile measured for each SOC of the secondary battery, or at least one inflection point appears in an open-circuit profile measured for each depth of discharge (DOD) of the secondary battery.

22. A method for estimating an electrical parameter, the method comprising:
- measuring, by a sensor, current-voltage data repeatedly at a time interval while a secondary battery is charged in such a pattern that the charging current increases to a peak value and then decreases to less than a fraction of the peak value;
- receiving, by a controller, an input of the plurality of current-voltage data from the sensor;
- identifying, by the controller, a plurality of current-voltage data measured while the charging current decreases from the peak value, among the measured current-voltage data;
- calculating, by the controller, a linear approximation equation, below:

$$V=a*I+b,$$

where V is an output voltage of the secondary battery, I is an input current of the secondary battery, a is a resistance characteristic, and b is the output voltage when the input current of the secondary battery is zero,
- wherein the linear approximation equation represents a correlation between the input current and the output voltage from the plurality of identified current-voltage data measured by the sensor after the charging current decreases to less than the fraction of the peak value;
- estimating, by the controller, a Y intercept of the linear approximation equation as an open-circuit voltage of the secondary battery, and then estimating a state of charge (SOC) of the secondary battery from the estimated open-circuit voltage;
- storing, by the storage, the estimated open-circuit voltage and the estimated SOC; and
- transmitting, by the transceiver, the estimated open-circuit voltage and the estimated SOC to an external controller that charges and discharges the secondary battery using the estimated open-circuit voltage and the estimated SOC of the secondary battery to maximize the usage efficiency of the secondary battery.

23. The method for estimating the electrical parameter according to claim 22, further comprising:
- displaying the estimated open-circuit voltage.

24. The method for estimating the electrical parameter according to claim 22, further comprising:
- displaying the estimated SOC.

25. The method for estimating the electrical parameter according to claim 22, wherein the secondary battery includes a blended cathode material in which at least two cathode materials are blended, and
- wherein a blend ratio of a first of the two cathode materials and a second of the two cathode materials is selected such that a convex pattern, with an inflection point that is present before and after a peak, appears in a discharge resistance profile measured for each SOC of the secondary battery, or at least one inflection point appears in an open-circuit profile measured for each depth of discharge (DOD) of the secondary battery.

* * * * *